(12) United States Patent
Lackey

(10) Patent No.: US 7,484,149 B2
(45) Date of Patent: Jan. 27, 2009

(54) NEGATIVE EDGE FLIP-FLOPS FOR MUXSCAN AND EDGE CLOCK COMPATIBLE LSSD

(75) Inventor: David E. Lackey, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 11/276,768

(22) Filed: Mar. 14, 2006

(65) Prior Publication Data

US 2007/0220382 A1   Sep. 20, 2007

(51) Int. Cl.
 *G01R 31/28* (2006.01)
(52) U.S. Cl. ..................................... 714/726
(58) Field of Classification Search ............... 714/726
 See application file for complete search history.

(56) References Cited

U.S. PATENT DOCUMENTS

| | | | |
|---|---|---|---|
| 6,300,809 B1 | 10/2001 | Gregor et al. | |
| 6,445,236 B1 | 9/2002 | Bernard et al. | |
| 6,567,943 B1 | 5/2003 | Barnhart et al. | |
| 6,693,460 B2 | 2/2004 | Kanba | |
| 6,785,855 B2 * | 8/2004 | Zhang et al. | 714/731 |
| 7,038,494 B2 * | 5/2006 | Morton | 326/93 |
| 7,353,441 B2 * | 4/2008 | Hirano | 714/726 |
| 2003/0218488 A1 | 11/2003 | Parulkar et al. | |
| 2005/0050415 A1 | 3/2005 | Gass | |
| 2007/0022339 A1 * | 1/2007 | Branch et al. | 714/726 |

FOREIGN PATENT DOCUMENTS

| | | |
|---|---|---|
| JP | 11352191 | 12/1999 |
| JP | 2001013223 | 1/2001 |
| JP | 2003057307 | 2/2003 |

* cited by examiner

*Primary Examiner*—James C Kerveros
(74) *Attorney, Agent, or Firm*—Schmeiser, Olsen & Watts; Anthony J. Canale

(57) ABSTRACT

A method of synchronous digital operation and scan based testing of an integrated circuit using a flip-flop. The flip-flop including a master latch having an input and a clock pin; a slave latch having an output, a first clock pin and a second clock pin, the slave latch connected to the master latch; a first AND gate having a first input, an inverted second input and an output, the output of the first AND gate connected to the first clock pin of the master latch; a second AND gate having a first input, an inverted second input and an output, the output of the second AND gate connected to the second input of the first AND gate and to the first clock pin of the slave latch.

1 Claim, 7 Drawing Sheets

US 7,484,149 B2

NEGATIVE EDGE FLIP-FLOPS FOR MUXSCAN AND EDGE CLOCK COMPATIBLE LSSD

FIELD OF THE INVENTION

The present invention relates to latches that provide clock edge-triggered system behavior and improved methods of testing, particularly in LSSD testing.

BACKGROUND OF THE INVENTION

Traditional positive and negative edge triggered scan design requires precise control of the time scan and actual data is presented to and transferred from the latches of scan chains. These requirements create a burden in the chip design cycle, in that the chip designer must ensure that all signals in the scan chain path and data path arrive at the latch after the clock edge arrives. This is generally accomplished using external circuitry. Thus the present methodologies are time-consuming to implement and utilize relatively complicated circuitry. Therefore, there is a need for a methodology that overcomes the need for external circuitry and reduces the burden on the designer.

SUMMARY OF THE INVENTION

A first aspect of the present invention is a flip-flop, comprising: a master latch having an input and a clock pin; a slave latch having an output, a first clock pin and a second clock pin, the slave latch connected to the master latch; a first AND gate having a first input, an inverted second input and an output, the output of the first AND gate connected to the first clock pin of the master latch; and a second AND gate having a first input, an inverted second input and an output, the output of the second AND gate connected to the second input of the first AND gate and to the first clock pin of the slave latch.

A second aspect of the present invention is a method of synchronous digital operation and scan based testing of an integrated circuit, comprising: providing a flip-flop comprising: a master latch having an input and a clock pin; a slave latch having an output, a first clock pin and a second clock pin, the slave latch connected to the master latch; and capturing data presented at the input of the master latch and transferring data stored in the master latch to the slave latch in response to a negative edge of a first clock signal on the clock pin of the master latch; launching data stored in the slave latch to the output of the slave latch in response to the negative edge of the first clock signal; and capturing data presented at the input of the master latch in response to a positive edge of a second clock signal on the clock pin of the master latch.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

In LSSD testing, an integrated circuit chip having logic circuits is fabricated with scan chains that allow testing of the integrated circuit chip logic circuits. A negative edge of a signal is defined as the falling edge of the signal (e.g. the transition from a logical one to a logical zero). A logical zero on a signal is equivalent to a "low" on the signal and a logical one is equivalent to a "high" on the signal. A clock period is the time duration of adjacent high and low assertions. For the purposes of the present invention, a clock signal is asserted when it is in the high state.

Figure 1:
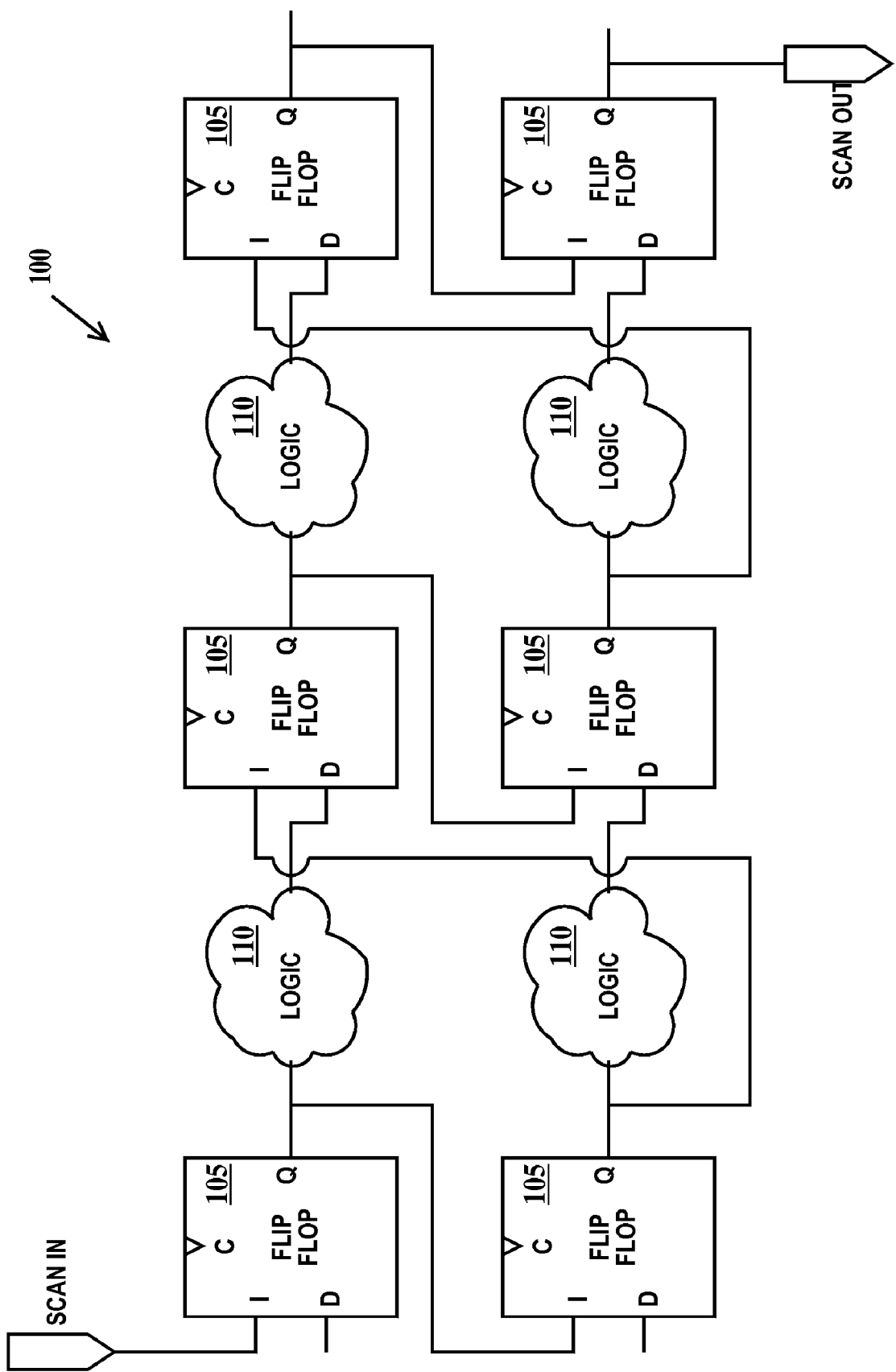
FIG. 1 is a schematic of an exemplary LSSD scan chain utilizing flip-flops according to embodiments of the present invention.

FIG. 1 is a schematic of an exemplary LSSD scan chain utilizing latches according to embodiments of the present invention. In FIG. 1 an exemplary scan chain 100 includes a set of flip-flops 105 connected in series. Each flip-flop 105 includes at least one clock input pin (C), a scan input pin (I) a data input pin (D) and an output pin (Q). The output of each flip-flop is connected to the scan input of the next flip-flop 105 in the series except the output of the last flip-flop 105 is connected to a scan out pin. The scan input of the first flip-flop 105 in the series is connected to a scan-in pin. Logic circuits 110 that perform the normal functions of the integrated circuit chip are connected between the output and input of two different flip-flops 105.

In normal operating mode, flip-flops 105 are set to transmit signals between their data inputs to their data outputs. In test mode, a vector of test data (typically a series of logical ones (1) and logical zeros (0)) is serially loaded into flip-flops 105 of through the scan in pin, the data passed from the data output of one flip-flop 105 to the data input of another flip-flop 105 through logic circuits 110, and then resultant vector is serially unloaded from flip-flops 105 san chain through the scan out pin.

While six flip-flops 105 are illustrated in FIG. 1, it should be understood, that LSSD scan chains may include any number of flip-flops 105 and scan chains having several thousand flip-flops 105 is not unusual. Likewise, more than two flip-flops 105 may be connected to the same logic circuit 110. While all flip-flops 105 may be identical, generally all logic circuit 110 are not identical.

Figure 2:
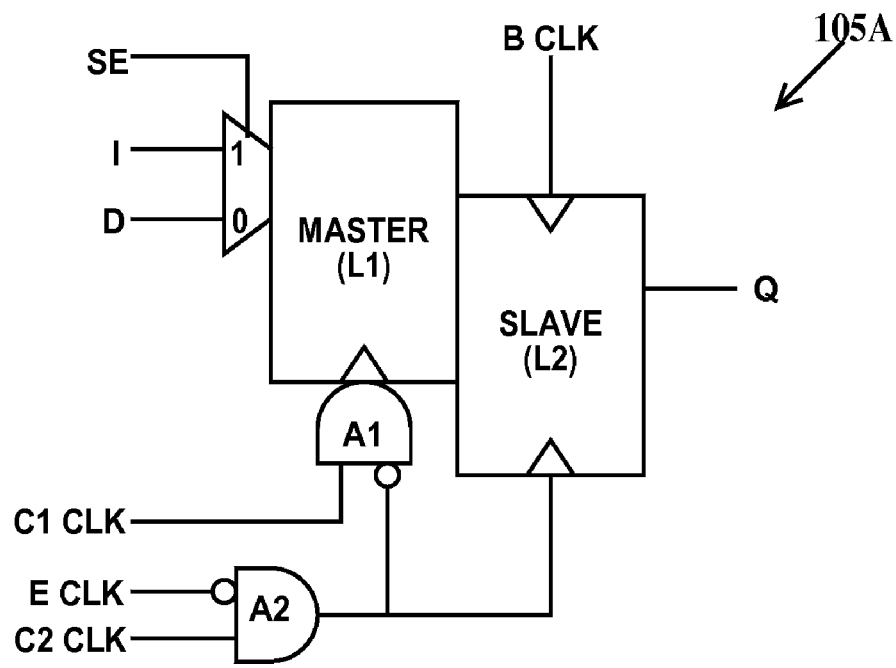
FIG. 2 is a schematic diagram of first flip-flop according to a first embodiment of the present invention.

FIG. 2 is a schematic diagram of flip-flop according to a first embodiment of the present invention. In FIG. 2, a single-port mux-driven negative edge triggered gate flip-flop (MNG) 105A comprises a master/slave latch having a master (L1) section and a slave (L2) section, a multiplexer (MUX), a first AND gate A1 and a second AND gate A2. The MUX has a scan input pin (I) and a data input pin (D) and is responsive to a scan enable signal (SE). The output of the MUX is connected to the single data input pin of L1. The output of first AND gate A1 is connected to a single clock pin of L1 and the output of second AND gate A2 is connected to a first clock pin of L2. A first clock signal (B CLK) is connected to a second clock pin of L2. A second clock signal (C1 CLK) is connected to a first input of first AND gate A1. The output of second AND gate A2 is also connected to a second and inverted input of first AND gate A1. A third clock signal (C2 CLK) is connected to a first input of second AND gate A2 and a fourth clock signal (E CLK) is connected to a second and inverted input of second AND gate A2.

The test signals are SE, C1 CLK, C2 CLK, B CLK and I. The system (normal operation) signals are D, Q and E CLK. C1 CLK clocks scan data 1 (or system data D) into L1, C2 CLK clocks L2 from L1 and B CLK shifts data in L1 of a previous latch into L2 of the next sequential L1 for scan shifting (loading the scan test vector into the scan chains).

Figure 3:
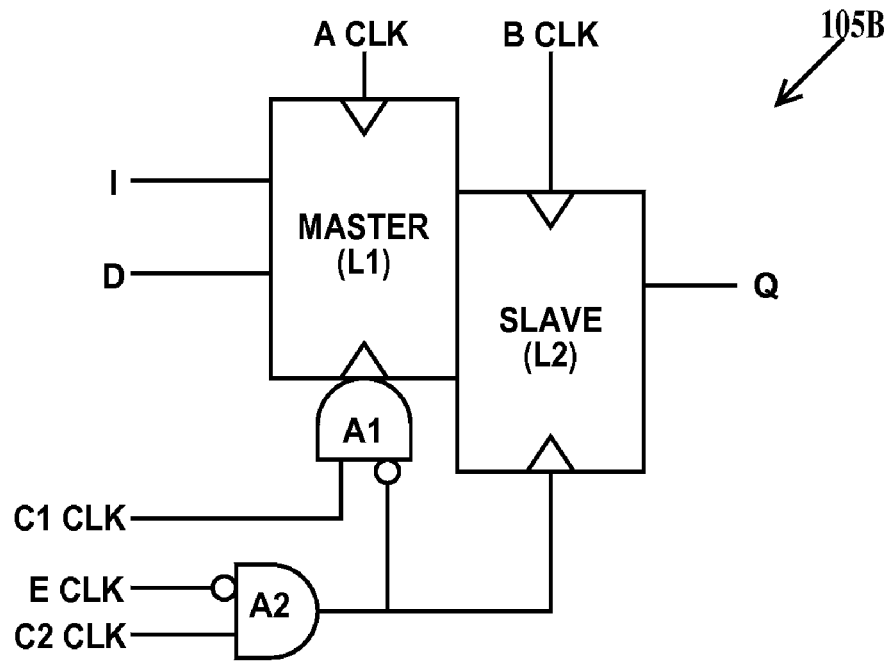
FIG. 3 is a schematic diagram of a second flip-flop according to a second embodiment of the present invention.

FIG. 3 is a schematic diagram of flip-flop according to a second embodiment of the present invention. In FIG. 2, a dual-port negative edge triggered gate flip-flop (LNG) 105A comprises a master/slave latch having a master (L1) section and a slave (L2) section, a first AND gate A1 and a second AND gate A2. L1 has a scan input pin (I) and a data input pin (D). The output of first AND gate A1 is connected to a first clock input pin of L1 and the output of second AND gate A2 is connected to a first clock pin of L2. A first clock signal (B CLK) is connected to a second clock pin of L2. A second clock signal (C1 CLK) is connected to a first input of first AND gate A1. The output of second AND gate A2 is also connected to a second and inverted input of first AND gate A1. A third clock signal (C2 CLK) is connected to a first input of second AND gate A2 and a fourth clock signal (E CLK) is connected to a second and inverted input of second AND gate A2. A fifth clock signal (A CLK) is connected to a second clock pin of L1.

The test signals are C1 CLK, C2 CLK, B CLK, A CLK and I. The system signals are D, Q and E CLK. A CLK clocks scan data 1 into L1, C1 CLK clocks system data D into L1.

Figure 4A:
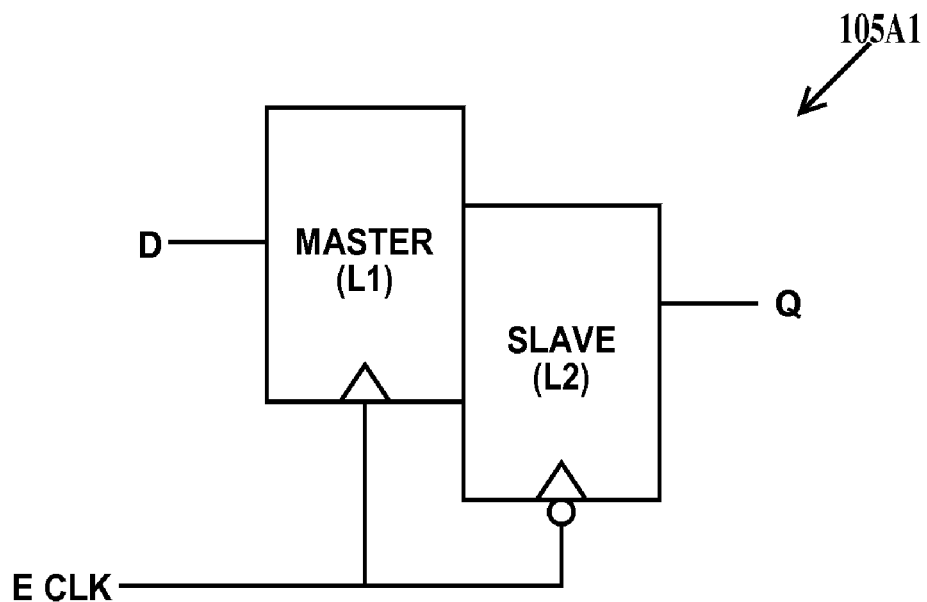
FIG. 4A is an equivalent circuit and FIG. 4B is a timing diagram of the first flip-flop of FIG. 2 under normal operating conditions.
Figure 4B:
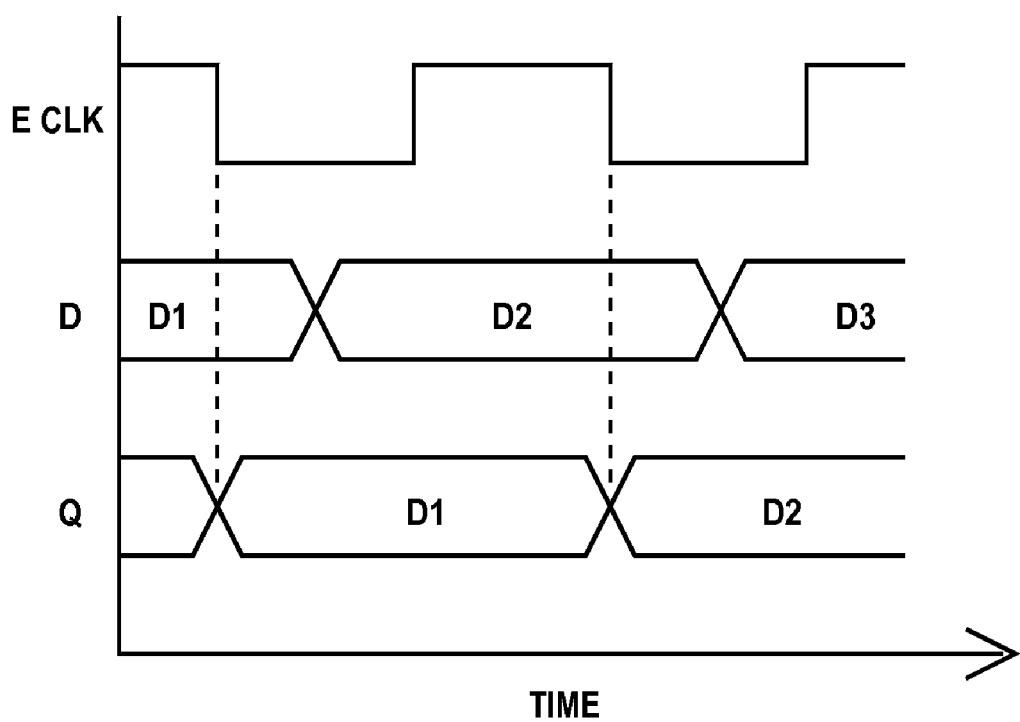

FIG. 4A is an equivalent circuit and FIG. 4B is a timing diagram of the first flip-flop of FIG. 2 under normal operating conditions. For normal operation the test signals are held inactive, SE=0, C1 CLK=1, C2=CLK=1, B CLK=0 and I="don't care." "Don't care" can be a logical one or a logical zero. Under normal operating conditions MNG 105A of FIG. 2 reduces an equivalent circuit MNG 105A1 comprising L1 having a D input pin and a clock pin connected to E CLK and L2 having a Q output and a clock pin connected to E CLK. Data D1, D2, D3 . . . is transferred from input pin D to output pin Q on the negative edge of E CLK.

Figure 5A:
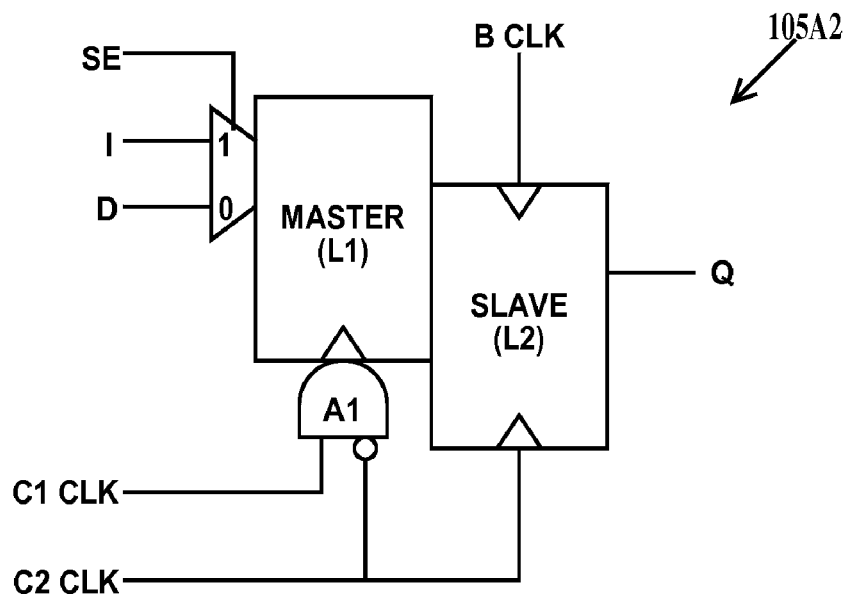
FIG. 5A is an equivalent circuit under test conditions.
Figure 5B:
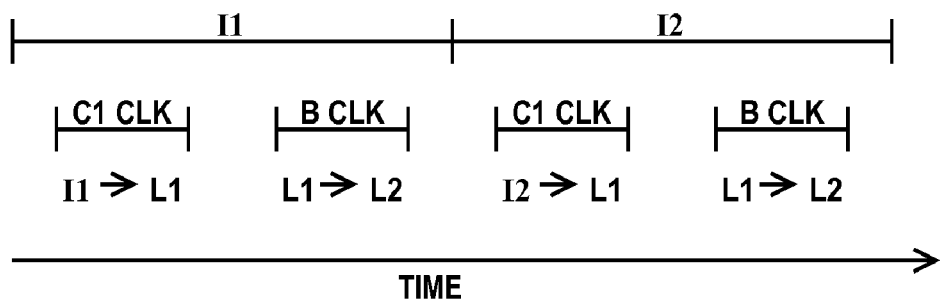
FIG. 5B is a timing diagram during scan chain loading and FIG. 5C is a timing diagram during test of the first flip-flop of FIG. 2.
Figure 5C:
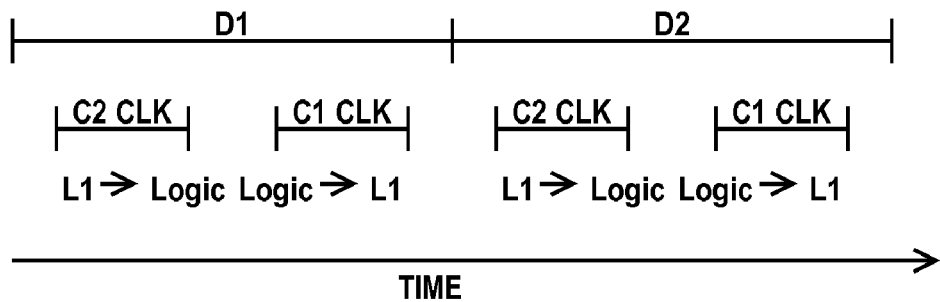

FIG. 5A is an equivalent circuit under test conditions, FIG. 5B is a timing diagram during scan chain loading and FIG. 5C is a timing diagram during test of the first flip-flop of FIG. 2. For test operations CLK E ="don't care." Under test conditions MNG 105A of FIG. 2 reduces to an equivalent circuit MNG 105A2 comprising the first AND gate A1, L1, L2 and MUX. The output of first AND gate A1 is connected to the clock pin of L1, C2 CLK is connected the second and inverted input of first AND gate A1 and to the first clock input of L2, and C1 CLK is connected to the first input of first AND gate A1. B CLK is connected to the second clock input of L2. The MUX is connected to the data input of L1 and has a scan input pin (I) and data input pin (D) and is responsive to scan enable signal (SE).

In FIG. 5B, during scan chain loading (and unloading) SE=1, I1, I2 . . . is loaded into L1 when C1 CLK is asserted (C CLK=1) and transferred to L2 when B CLK is asserted (B CLK=1).

In FIG. 5C, during testing (launch/capture) SE=0, B CLK=0, test data D1, D2 . . . is launched into the logic circuits from L1 when C2 CLK is asserted (C2 CLK=1) and captured by L2 from the logic circuits when C1 CLK is asserted (C1 CLK=1).

Figure 6A:
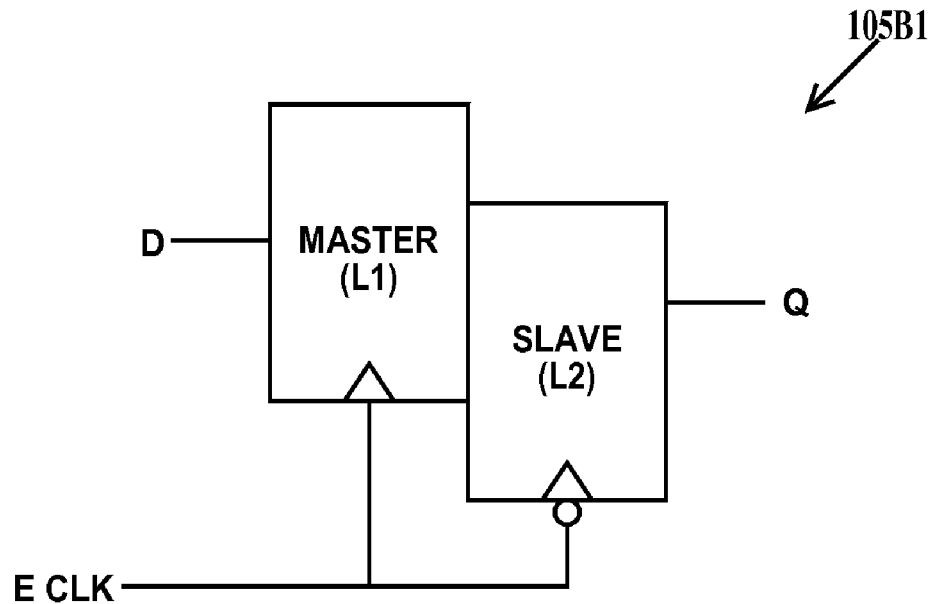
FIG. 6A is an equivalent circuit and FIG. 6B is a timing diagram of the second flip-flop of FIG. 3 under normal operating conditions.
Figure 6B:
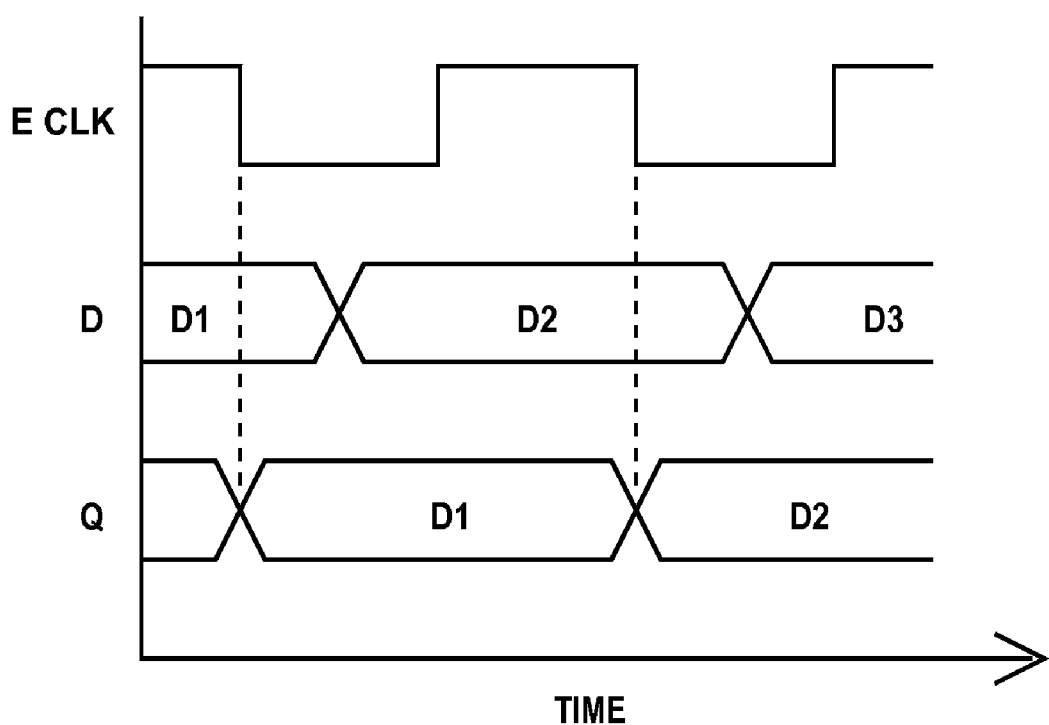

FIG. 6A is an equivalent circuit and FIG. 6B is a timing diagram of the second flip-flop of FIG. 3 under normal operating conditions. For normal operation the test signals are held inactive C1 CLK=1, C2=CLK=1, B CLK=0, A CLK=0 and I="don't care." Under normal operating conditions LNG 105A of FIG. 2 reduces to an equivalent circuit LNG 105B1 comprising L1 having a D input pin and a clock pin connected to E CLK and L2 having a Q output and an inverted clock pin connected to E CLK. Data D1, D2, D3 . . . is transferred from input pin D to output pin Q on the negative edge of E CLK.

Figure 7A:
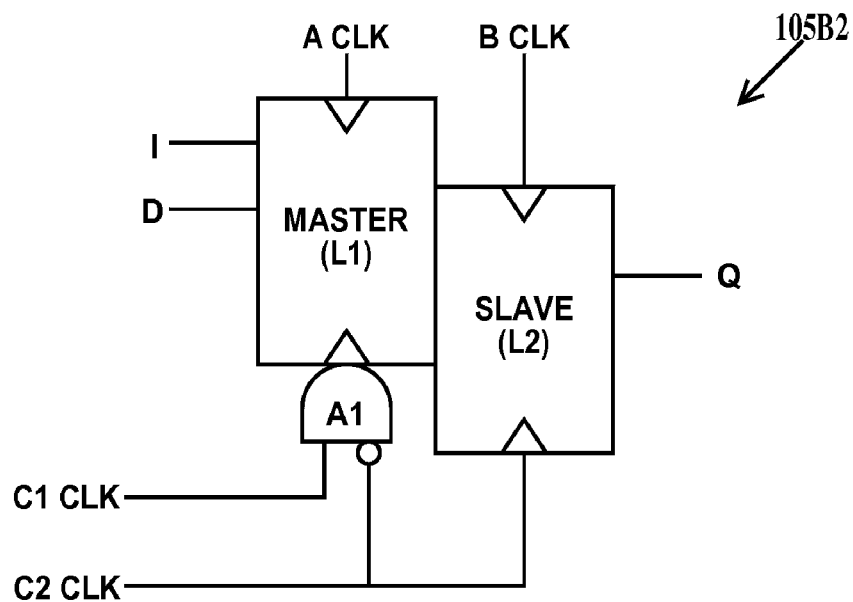
FIG. 7A is an equivalent circuit under test conditions.
Figure 7B:
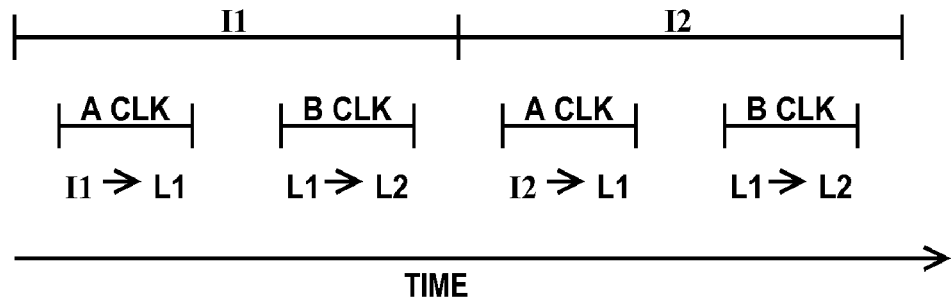
FIG. 7B is a timing diagram during scan chain loading and FIG. 7C is a timing diagram during test of the second flip-flop of FIG. 3.
Figure 7C:
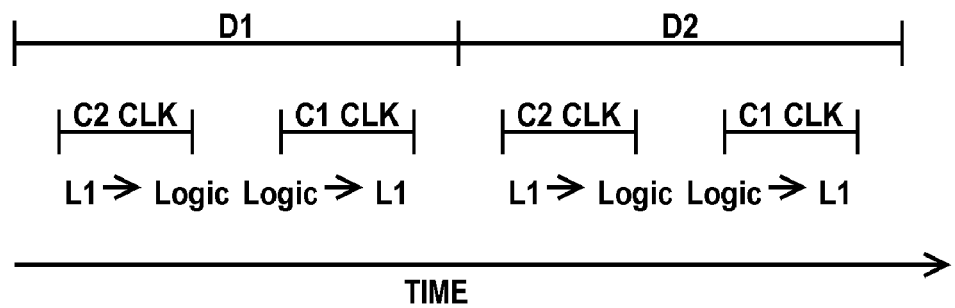

FIG. 7A is an equivalent circuit under test conditions, FIG. 7C is a timing diagram during scan chain loading and FIG. 7C is a timing diagram during test of the second flip-flop of FIG. 3. For test operations CLK E="don't care." Under test conditions LNG 105B of FIG. 3 reduces to an equivalent circuit LNG 105B2 comprising the first AND gate A1, L1, and L2. The output of first AND gate A1 is connected to the first clock pin of L1, C2 CLK is connected the second and inverted input of first AND gate A1 and to the first clock input of L2, and C1 CLK is connected to the first input of first AND gate A1. A CLK is connected to the second clock input of L1 and B CLK is connected to the second clock input of L2.

In FIG. 7B, during scan chain loading (and unloading) I1, I2 . . . is loaded into L1 when C1 CLK is asserted (C1 CLK=1) and transferred to L2 when B CLK is asserted (B CLK=1).

In FIG. 7C, during testing (launch/capture) SE=0, B CLK=0, test data D1, D2 . . . is launched into the logic circuits from L1 when C2 CLK is asserted (C2 CLK=1) and captured by L2 from the logic circuits when C1 CLK is asserted (C1 CLK=1).

Figure 8A:
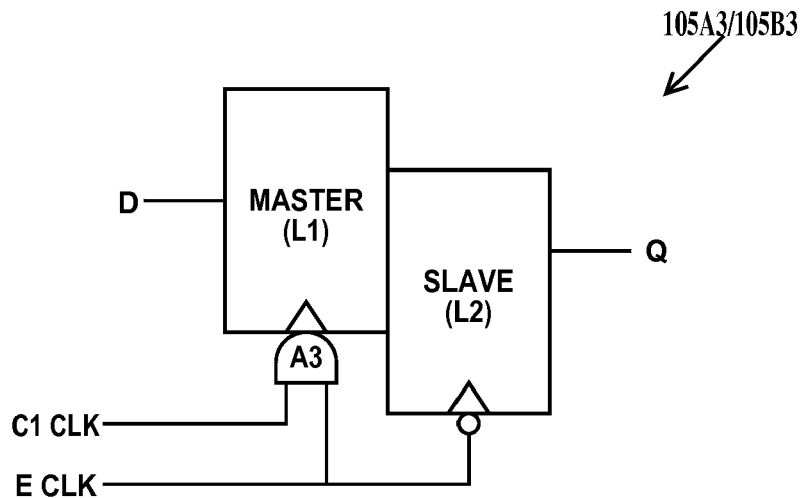
FIG. 8A is an equivalent circuit under at speed test conditions and FIG. 8B is a timing diagram during at speed test of the first flip-flop of FIG. 2 or the second flip-flop of FIG. 3.
Figure 8B:
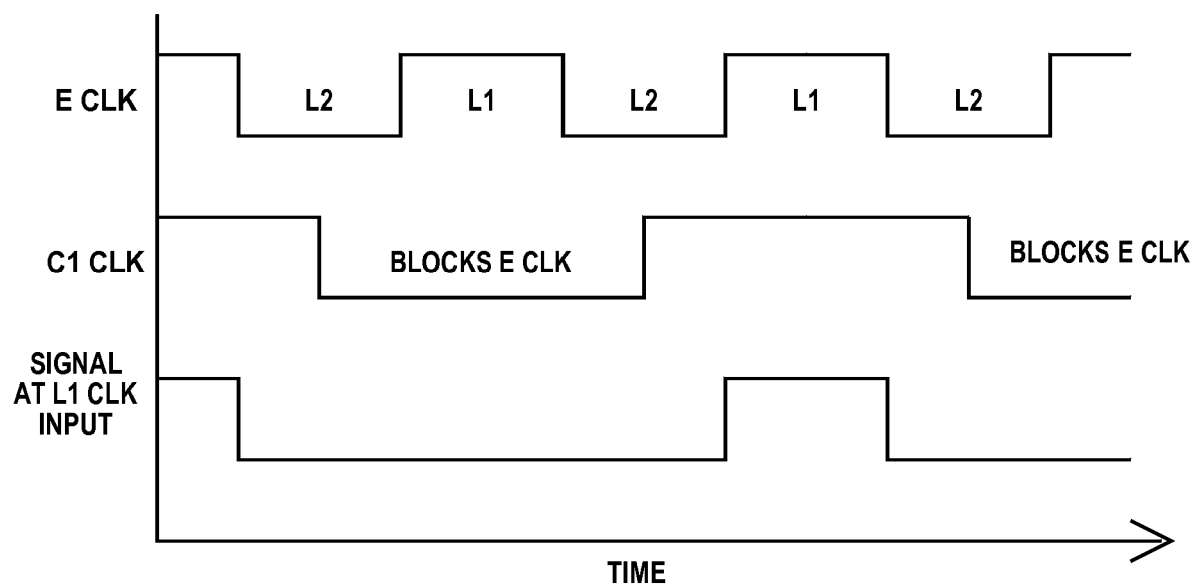

FIG. 8A is an equivalent circuit under at speed test conditions and FIG. 8B is a timing diagram during at speed test of the first flip-flop of FIG. 2 or the second flip-flop of FIG. 3. At speed testing means test data is cycled through the logic circuits at normal operational speeds rather than at test speeds. Typically test clocks C1 CK, C2 CLK, B CLK and A CLK run at lower frequencies than system E CLK. At speed testing utilizes E CLK for shifting test data from L1 to L2 rather than the C1 CLK and the C2 CLK. For at speed test operations A CLK=0 and B CLK=0. Under test conditions MNG 105A of FIG. 2 and LNG 105B of FIG. 3 both reduce to an equivalent circuit MNG/LNG 105A3/105B3 comprising the an AND gate A3, an inverter T1, L1, and L2. The output of AND gate A3 is connected to the first clock pin of L1, E CLK is connected the second input of AND gate A3 and to the first clock input of L2, and C1 CLK is connected to the first input of AND gate A3. E CLK is also connected to the inverted first clock input pin of L2.

In FIG. 8B, E CLK is ANDed with C1 CLK to produce the signal at L1 CLK INPUT. In this example the test clock C1 CLK has a frequency of half that of system CLK C1. In system mode L1 will latch data when E CLK is a logical one and L2 will latch data when E CLK is a logical zero. In test mode, L1 will latch data when L1 CLK INPUT is a logical one and L2 will latch data when E CLK is a logical zero. Therefore C1 can be used to selectively cycle E CLK while L1 CLK is or is not pulsed high in concert with E CLK. This allows at-speed testing whereby (1) a test pattern scanned into L1 latches of flip-flops 105 of scan chain 100 (see FIG. 1) while C1 is held low to block L1 CLK, (2) will be launched by L2 latches of flip-flops 105 into combinational logic in response to first negative pulse on E CLK, and (3) the test pattern results will be captured into the L1 latches in response to both the next positive pulse on E CLK and by bringing C2 high prior to this next positive pulse.

Thus the embodiments of the present invention provide a scan-based testing methodology that overcomes the need for external circuitry and reduces the burden on the designer as well as a methodology for at-speed testing.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A flip-flop, comprising:
   a master latch having a data input and a clock pin, said master latch configured to capture data presented at said data input of said master latch and to transfer data stored in said master latch to said slave latch in response to a negative edge of a clock signal presented to said clock pin of said master latch;
   a slave latch having a data output, a first clock pin and a second clock pin, said slave latch connected to said master latch, said slave latch configured to launch data stored in said slave latch to said output of said slave latch in response to a negative edge of a clock signal presented to said first clock pin of said slave latch, said slave latch configured to load data stored in said master latch in response to a clock signal presented to said second clock pin of said slave latch, said second clock pin of said slave latch connected to a third clock signal;
   a multiplexer having first and second data inputs, a select input and an output, said output of said multiplexer connected to said data input of said master latch;
   a first AND gate having a first input connected to a second clock signal, an inverted second input and an output, said output of said first AND gate connected to said first clock pin of said master latch;
   a second AND gate having a first input, an inverted second input and an output, said output of said second AND gate connected to said second input of said first AND gate and to said first clock pin of said slave latch, said first input of said second AND gate connected to a fourth clock signal, said second input of said second AND gate connected to a first clock signal; and
   wherein said first, second, third and fourth clock signals are different clock signals.

* * * * *